US007489005B2

(12) United States Patent
Tanaka

(10) Patent No.: US 7,489,005 B2
(45) Date of Patent: Feb. 10, 2009

(54) EEPROM

(75) Inventor: Kouji Tanaka, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 37 days.

(21) Appl. No.: 11/604,290

(22) Filed: Nov. 27, 2006

(65) Prior Publication Data

US 2007/0122974 A1      May 31, 2007

(30) Foreign Application Priority Data

Nov. 28, 2005   (JP)   ............................... 2005-342044

(51) Int. Cl.
*G11C 11/34*   (2006.01)
*G11C 16/04*   (2006.01)
(52) U.S. Cl. ............. 257/316; 365/185.24; 365/185.09; 257/E21.682; 257/E29.129; 257/E29.304; 257/314; 257/315
(58) Field of Classification Search ............. 365/185.1, 365/94, 156, 185.33, 103, 104, 315, 320; 257/E27.103, E21.18, E21.682, E29.129, 257/E29.304
See application file for complete search history.

(56) References Cited

U.S. PATENT DOCUMENTS 5,604,700 A * 2/1997 Parris et al. ............... 365/185.1
5,998,830 A * 12/1999 Kwon .......................... 257/315
6,034,893 A * 3/2000 Mehta .................... 365/185.14
6,054,732 A * 4/2000 Ho et al. ....................... 257/314
6,232,631 B1 * 5/2001 Schmidt et al. ............. 257/315
6,261,884 B1 * 7/2001 Ho et al. ...................... 438/199
6,285,238 B1 * 9/2001 Wu .............................. 327/525
6,731,541 B2 * 5/2004 Kinsey et al. .......... 365/185.18
6,788,574 B1   9/2004 Han et al.
2005/0083744 A1   4/2005 Arai
2005/0263767 A1 * 12/2005 Yamazaki et al. .............. 257/72

FOREIGN PATENT DOCUMENTS

| JP | 6-334190 | 2/1994 |
| JP | 2000-340773 | 8/2000 |
| JP | 2001-185633 | 6/2001 |
| KR | 10-2005-0035096 | 4/2005 |

OTHER PUBLICATIONS

Korean Office Action dated Apr. 18, 2008 with Partial English Translation.

* cited by examiner

*Primary Examiner*—Walter L Lindsay, Jr.
*Assistant Examiner*—Mohsen Ahmadi
(74) *Attorney, Agent, or Firm*—McGinn IP Law Group, PLLC

(57) ABSTRACT

An EEPROM having a nonvolatile memory cell is provided. The nonvolatile memory cell has a first MOS transistor and a second MOS transistor. The first MOS transistor and the second MOS transistor have a gate electrode in common, the gate electrode being a floating gate electrically isolated from a surrounding circuitry. The first MOS transistor and the second MOS transistor are of a same conductivity type.

17 Claims, 7 Drawing Sheets

ERASE

READ

EEPROM

BACKGROUND OF THE INVENTION

1. Field of the Invention

The present invention relates to a nonvolatile memory, and particularly relates to an EEPROM (Electrically Erasable and Programmable Read Only Memory).

2. Description of the Related Art

An EEPROM is known as a nonvolatile memory capable of electrically programming and erasing data. A "single poly EEPROM" is a type of the EEPROM, which does not have a stacked gate but a single-layer gate. Such a single poly EEPROM is disclosed, for example, in the following patent documents.

In an EEPROM described in Japanese Laid-Open Patent Application JP-P2000-340773, an N+ diffusion layer formed in a surface portion of a semiconductor substrate functions as a control gate. The N+ diffusion layer overlaps a single-layer gate (floating gate) formed on the semiconductor substrate. The single-layer gate also overlaps a tunnel region in the semiconductor substrate, and charges are injected into the single-layer gate from the tunnel region. Furthermore, the EEPROM has a MOS transistor that uses the single-layer gate as a gate electrode. The above-mentioned tunnel region is a part of a source or a drain of the MOS transistor.

An EEPROM described in Japanese Laid-Open Patent Application JP-P2001-185633 has: a first N-well and a second N-well which are formed in a substrate; a single-layer gate (floating gate) formed on the substrate; and a read transistor. The first N-well and the single-layer gate overlap each other through a gate insulating film to form a first capacitor. The second N-well and the single-layer gate overlap each other through a gate insulating film to form a second capacitor. A P-type diffusion layer and an N-type diffusion layer are formed in each of the first and the second N-wells. The P-type diffusion layer is formed around the single-layer gate, while the N-type diffusion layer is formed away from the single-layer gate. Charges are injected into the single-layer gate through the gate insulating film at the first capacitor or the second capacitor.

An EEPROM described in U.S. Pat. No. 6,788,574 has: a first N-well and a second N-well which are formed in a substrate; a single-layer gate (floating gate) formed on the substrate; and a read transistor. The first N-well and the single-layer gate overlap each other through a gate insulating film to form a tunneling capacitor. The second N-well and the single-layer gate overlap each other through a gate insulating film to form a coupling capacitor. A P-type diffusion layer and an N-type diffusion layer are formed in each of the first and the second N-wells. The P-type diffusion layer and the N-type diffusion layer are abutted to each other in each N-well. Charges are injected into the single-layer gate through the gate insulating film at the tunneling capacitor.

Japanese Laid-Open Patent Application JP-H06-334190 discloses a technique in which charges are injected into a single-layer gate through a gate insulating film at not the tunneling capacitor but at a transistor.

FIG. 1 shows a structure of an EEPROM cell described in the Japanese Laid-Open Patent Application JP-H06-334190. In FIG. 1, an N-well 104 is formed in a P-type semiconductor substrate 101, and a single-layer polysilicon (floating gate) 108 is formed on the P-type semiconductor substrate 101 through a gate insulating film. An NMOS transistor is formed on the P-type semiconductor substrate 101, while a PMOS transistor is formed on the N-well 104. More specifically, the NMOS transistor consists of N+ diffusion layers (source/drain) 102a, 102b and a gate electrode 103. On the other hand, the PMOS transistor consists of P+ diffusion layers (source/drain) 105a, 105b, an N+ diffusion layer 106 and a gate electrode 107. The above-mentioned single-layer polysilicon (floating gate) 108 is not only the gate electrode 103 of the NMOS transistor but also the gate electrode 107 of the PMOS transistor.

In the EEPROM cell thus constructed, charges are transferred with respect to the floating gate 108 through the gate insulating film of the NMOS transistor, by applying predetermined potentials to respective of terminals 109, 110 and 111. The PMOS transistor serves as a control gate. When electrons are injected into the floating gate 108, the CHE (channel hot electron) method can be employed, for example. On the other hand, when electrons are ejected from the floating gate 108, the FN (Fowler-Nordheim) tunneling method can be employed, for example.

FIG. 2 shows the case where electrons are ejected from the floating gate 108 in accordance with the FN tunneling method. In this case, a high potential Ve is applied to the source/drain 102a, 102b of the NMOS transistor through the terminals 109 and 110, while a ground potential is applied to the source/drain 105a, 105b and the N+ diffusion layer 106 of the PMOS transistor through the terminal 111. Thus, a strong electric field is generated between the gate electrode 103 and the source/drain 102a, 102b. As a result, electrons are ejected from the gate electrode 103 to the source/drain 102a, 102b due to the FN tunneling.

SUMMARY OF THE INVENTION

The inventor of the present application has recognized the following points. According to the CHE method in the conventional technique, electrons are injected into the floating gate 108 "locally", i.e. through a part of the gate insulating film between the P-type semiconductor substrate 101 and the gate electrode 103 shown in FIG. 1. Moreover, according to the FN tunneling method in the conventional technique, electrons move between the gate electrode 103 and the source/drain 102, as shown in FIG. 2. That is to say, the electron movement occurs "locally" through only a part of the gate insulating film at an end of the gate electrode 103. Such local charge injection and ejection cause deterioration of the gate insulating film. The deterioration of the gate insulating film decreases reliability of the memory cell.

The inventor of the present application has considered the above-described problem. In FIG. 2, the high potential Ve is applied to the source/drain 102 of the NMOS transistor and the ground potential is applied to the N-well 104. Here, the high potential Ve can not be applied to the P-type semiconductor substrate 101, because the P-type semiconductor substrate 101 contacts the N-well 104 and hence the application of the high potential Ve to the P-type semiconductor substrate 101 results in application of a forward bias to the p-n junction. The P-type semiconductor substrate 101 should be electrically isolated from the source/drain 102 and its potential is set to the ground potential. Since the potentials applied to respective of the P-type semiconductor substrate 101 and the source/drain 102 are the ground potential and the high potential Ve, the electric field is nonuniformly applied to the gate insulating film. The nonuniform electric field causes the above-described local charge transfer through the part of the gate insulating film.

In an aspect of the present invention, an EEPROM having a nonvolatile memory cell is provided. The nonvolatile memory cell has a first MOS transistor and a second MOS transistor. The first MOS transistor and the second MOS transistor have a gate electrode in common, and the gate electrode is a floating gate electrically isolated from a surrounding circuitry. According to the present invention, the first MOS transistor and the second MOS transistor are of the same conductivity type.

In a case where both of the first MOS transistor and the second MOS transistor are of a first conductivity type, respective of the first MOS transistor and the second MOS transistor are formed on wells of a second conductivity type. For example, the first MOS transistor is formed on a first well of the second conductivity type in a substrate, while the second MOS transistor is formed on a second well of the second conductivity type in the substrate. Since the first well and the second well are of the same second conductivity type, there is no constraint on the bias between the wells. It is therefore possible to apply the same potential to the source/drain and the well.

In data programming and erasing, for example, a first potential is applied to the first well and the source/drain of the first MOS transistor, and a second potential different from the first potential by a predetermined potential difference is applied to the second well and the source/drain of the second MOS transistor. Since the potential of the source/drain is equal to that of the well, an electric field is applied to the gate insulating film uniformly (evenly) and symmetrically. As a result, the charge injection and ejection with respect to the floating gate occur through the entire gate insulating film of any of the MOS transistors. In other words, the above-described local charge transfer through the part of the gate insulating film is prevented. Therefore, the deterioration of the gate insulating film is suppressed and thus the reliability of the memory cell is improved.

According to the nonvolatile memory cell and the EEPROM of the present invention, the local charge injection and ejection through the part of the gate insulating film are prevented. Therefore, the deterioration of the gate insulating film is suppressed and thus the reliability of the memory cell is improved.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A nonvolatile memory according to an embodiment of the present invention will be described below with reference to the attached drawings. The nonvolatile memory according to the embodiment is an EEPROM having a plurality of nonvolatile memory cells.

1. Structure and Principle

Figure 3:
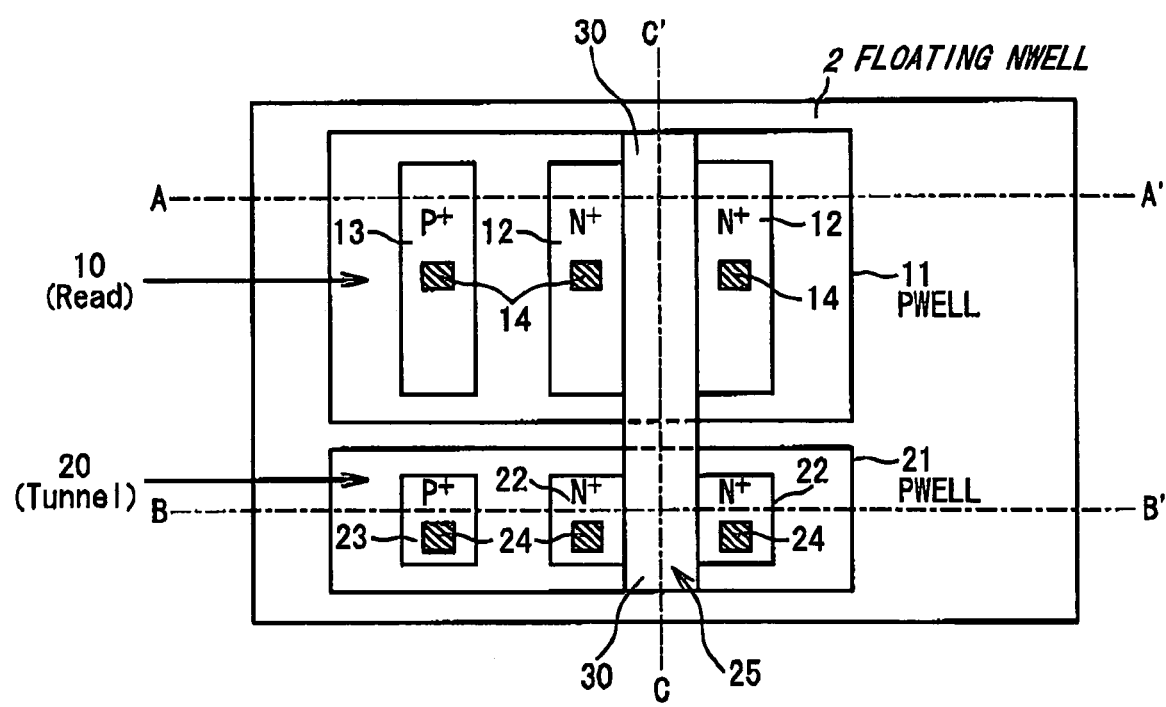
FIG. 3 is a plan view showing a structure of a nonvolatile memory cell (EEPROM) according to an embodiment of the present invention.
Figure 4A:
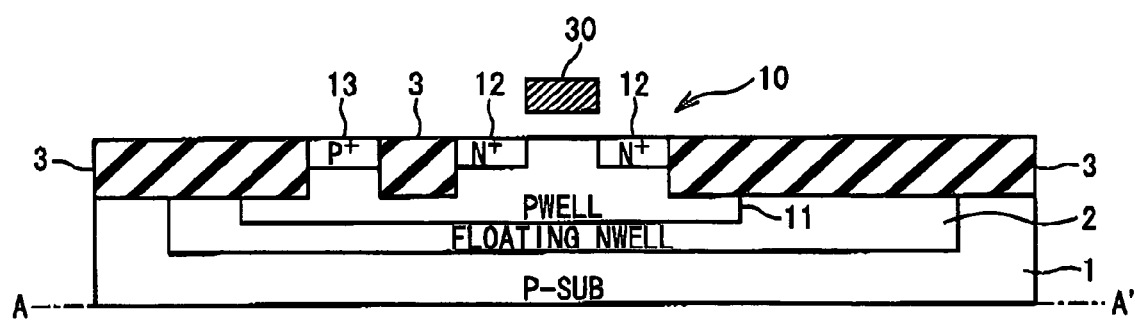
FIG. 4A is a cross-sectional view showing a structure along a line A-A' in FIG. 3.
Figure 4B:
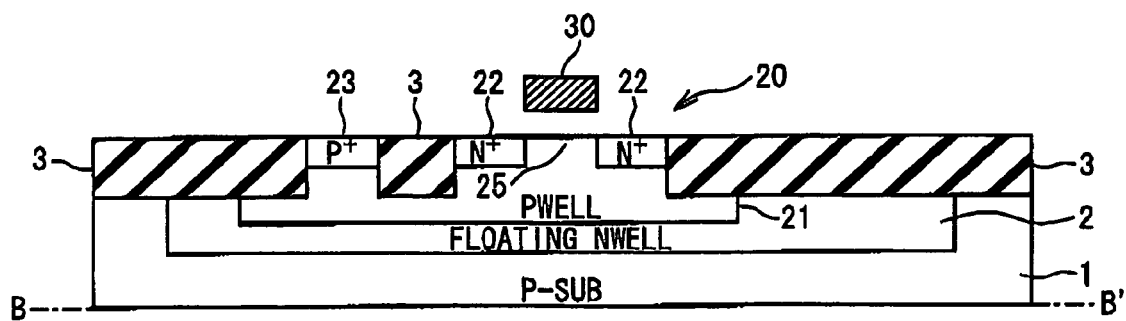
FIG. 4B is a cross-sectional view showing a structure along a line B-B' in FIG. 3.
Figure 4C:
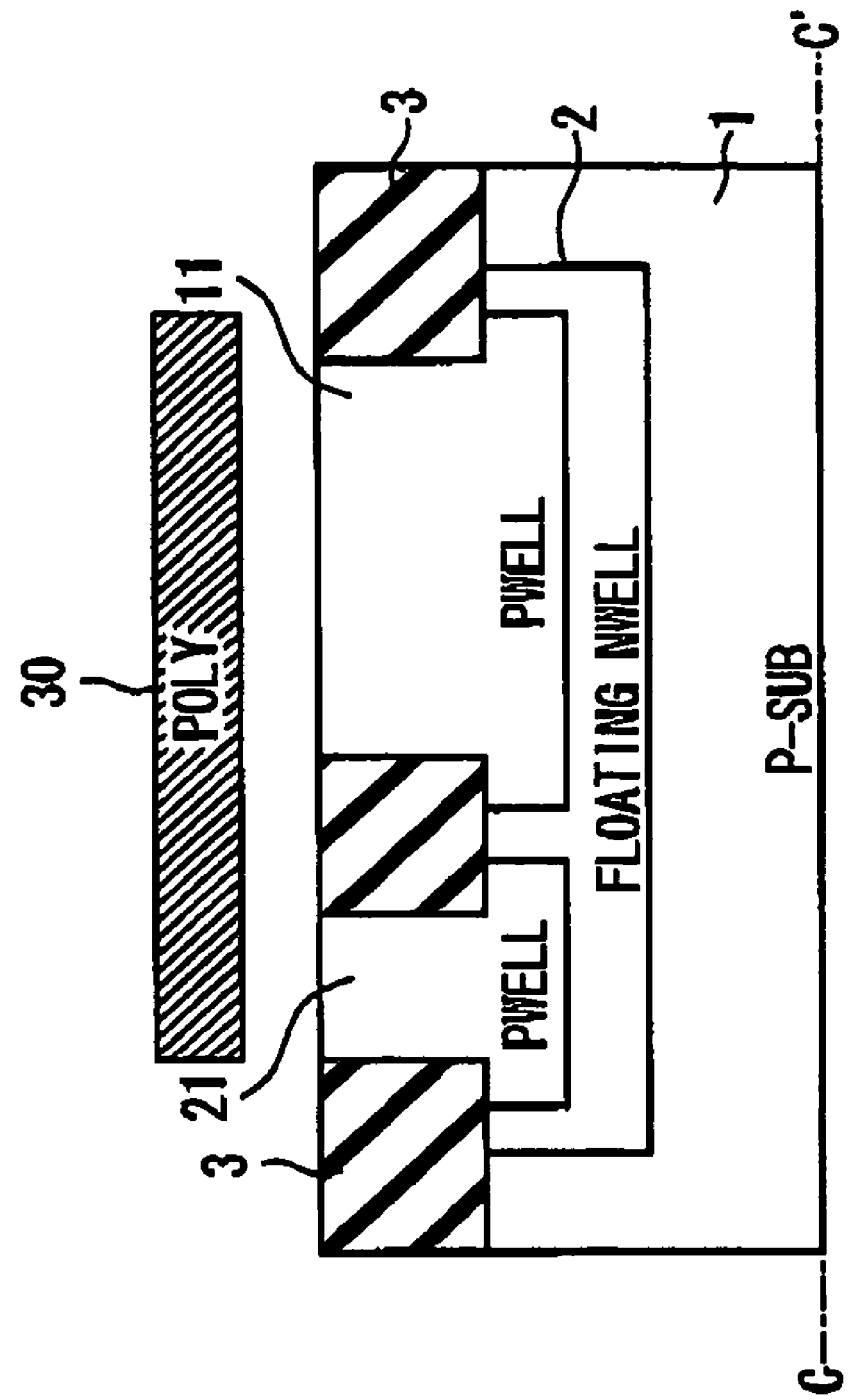
FIG. 4C is a cross-sectional view showing a structure along a line C-C' in FIG. 3.

FIG. 3 is a plan view showing a structure of the nonvolatile memory cell (EEPROM) according to the present embodiment. Cross-sectional structures along a line A-A', a line B-B' and a line C-C' in FIG. 3 are illustrated in FIG. 4A, FIG. 4B and FIG. 4C, respectively.

As shown in FIG. 3, the nonvolatile memory cell according to the present embodiment has a first MOS transistor 10 and a second MOS transistor 20. The first MOS transistor 10 and the second MOS transistor 20 have a gate electrode 30 in common. Here, the term "in common" means that potentials of gate electrodes of the respective MOS transistors are equal to each other. In that context, the respective gate electrodes may be formed separately and connected electrically with each other, as long as the potentials of the respective gate electrodes are the same. Preferably, one gate electrode 30 is formed as a common gate electrode of the first MOS transistor 10 and the second MOS transistor 20, as shown in FIG. 3.

The first MOS transistor 10 is, for example, an N-channel MOS transistor. As shown in FIG. 4A, a device isolation structure 3 is formed in a predetermined region of a surface portion of a P-type substrate 1. A floating N-well 2 is formed in the P-type substrate 1, and a F-well 11 is formed in the floating N-well 2. The first MOS transistor 10 is formed on the P-well 11. More specifically, N+ diffusion layers 12 as source/drain and a P+ diffusion layer 13 for supplying a well potential are formed in the P-well 11. On a region sandwiched between the N+ diffusion layers 12, the above-mentioned gate electrode 30 is formed through a gate insulating film. Moreover, as shown in FIG. 3, contacts 14 are formed to be connected to the N+ diffusion layers 12 and the P+ diffusion layer 13.

The second MOS transistor 20 is also an N-channel MOS transistor. As shown in FIG. 4B, the device isolation structure 3 is formed in a predetermined region of the surface portion of the P-type substrate 1. The floating N-well 2 is formed in the P-type substrate 1, and a P-well 21 is formed in the floating N-well 2. The second MOS transistor 20 is formed on the P-well 21. More specifically, N+ diffusion layers 22 as source/drain and a P+ diffusion layer 23 for supplying a well potential are formed in the P-well 21. On a region sandwiched between the N+ diffusion layers 22, the above-mentioned gate electrode 30 is formed through a gate insulating film. The region corresponds to a tunneling region 25 in which an FN tunneling current flows through the gate insulating film, as described later. Moreover, as shown in FIG. 3, contacts 24 are formed to be connected to the N+ diffusion layers 22 and the P+ diffusion layer 23.

As shown in FIG. 4C, the gate electrode 30 is so formed as to extend over the P-well 11 and the P-well 21. Preferably, the gate electrode 30 has a single-layer structure and is formed of, for example, a single-layer polysilicon. The single-layer gate electrode 30 is surrounded by an insulating film and electrically isolated from the surrounding circuitry. That is, the single-layer gate electrode 30 serves as a "floating gate".

The P-well 11 and the P-well 21 are capacitively coupled to the floating gate 30, and any of them serves as a "control gate". In the present embodiment, for example, the P-well 11 on which the first MOS transistor 10 is formed functions as the control gate. On the other hand, the charge injection and ejection with respect to the floating gate 30 occur in the tunneling region 25 through the gate insulating film (tunnel insulating film) of the second MOS transistor 20.

The principle of the charge transfer with respect to the floating gate 30 is as follows. A first potential is applied to the N+ diffusion layers 12 and the P-well 11 of the first MOS transistor 10 through the contacts 14 shown in FIG. 3. Also, a second potential is applied to the N+ diffusion layers 22 and the P-well 21 of the second MOS transistor 20 through the contacts 24. The second potential is different from the first potential by a predetermined potential difference, and thus a potential corresponding to the predetermined potential difference is induced at the floating gate 30.

For example, a potential Ve is applied to the N+ diffusion layers 12 and the P-well 11 of the first MOS transistor 10, while a ground potential GND is applied to the N+ diffusion layers 22 and the P-well 21 of the second MOS transistor 20. A MOS capacitance (gate capacitance) of the first MOS transistor 10 is represented by C10, while a MOS capacitance of the second MOS transistor 20 is represented by C20. In this case, a potential Vg induced at the floating gate 30 due to the capacitive coupling is given by the following equation (1).

$$Vg = C10/(C10+C20)*Ve \quad\quad \text{Eq. (1)}$$
$$= (1/(1+C20/C10))*Ve$$

In the equation (1), the parameter "C20/C10" is called a "capacitance ratio". The potential difference (voltage) between the potential Vg of the floating gate 30 and the ground potential GND is applied to the gate insulating film of the second MOS transistor 20. The FN tunneling occurs due to a strong electric field corresponding to that voltage, and thereby charges are transferred through the gate insulating film of the second MOS transistor 20. A designer can set the capacitance ratio C20/C10 and the potential Ve such that the voltage Vg of a desired value is obtained. As the capacitance ratio C20/C10 is set smaller, the same voltage Vg can be obtained with a smaller potential Ve, namely the voltage Vg can be obtained efficiently. It is therefore preferable that an area of the second MOS transistor 20 is designed to be smaller than an area of the first MOS transistor 10 (C10>C20), as shown in FIG. 3.

To read data stored in the above-described nonvolatile memory, the potential state of the floating gate 30 is detected. In order to detect the potential state of the floating gate 30, a transistor (read transistor) that uses the floating gate 30 as a gate electrode is necessary. Therefore, any one of the first MOS transistor 10 and the second MOS transistor 20 should be used as the read transistor. In the present embodiment, the first MOS transistor 10 is used as the read transistor. In this case, stress is dispersed, because the transistor (second MOS transistor 20) in which the tunneling current flows at the time of the data programming/erasing and the transistor (first MOS transistor 10) used in the data reading are provided separately. Thus, deterioration of the gate insulating film is suppressed, which is preferable.

2. Operations

Next, data programming/erasing/reading operations of the nonvolatile memory cell according to the present embodiment will be described more in detail.

2-1. ERASE (Electron Injection)

Figure 5:
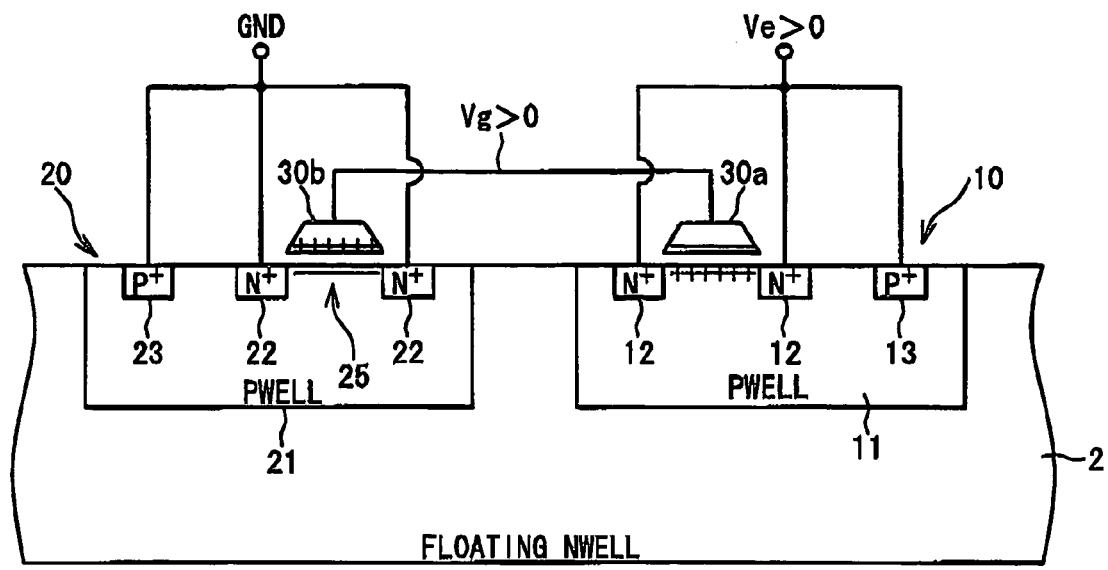
FIG. 5 is a schematic diagram showing a data erasing operation (ERASE) according to the present embodiment.

In the erasing operation, electrons are injected into the floating gate 30. FIG. 5 shows an example of a condition of the nonvolatile memory cell at the time of the erasing operation. In FIG. 5, the floating gate 30 is illustrated in such a manner that a gate electrode 30a for the first MOS transistor 10 and a gate electrode 30b for the second MOS transistor 20 are distinguishable from each other. The gate electrode 30a and the gate electrode 30b are electrically connected to each other, and their potentials Vg are the same.

The potentials applied to the P-well 11, the P-well 21, the N+ diffusion layers 12 and the N+ diffusion layers 22 can be designed appropriately. For example, as shown in FIG. 5, a positive erasing potential Ve is applied to the P-well 11 and the N+ diffusion layers (source/drain) 12 of the first MOS transistor 10. On the other hand, the ground potential GND is applied to the P-well 21 and the N+ diffusion layers (source/drain) 22 of the second MOS transistor 20. As a result, the potential Vg as given by the above equation (1) is induced at the floating gate 30. In this case, the first MOS transistor 10 is in an accumulation mode, while the second MOS transistor 20 is in an inversion mode.

Figure 6:
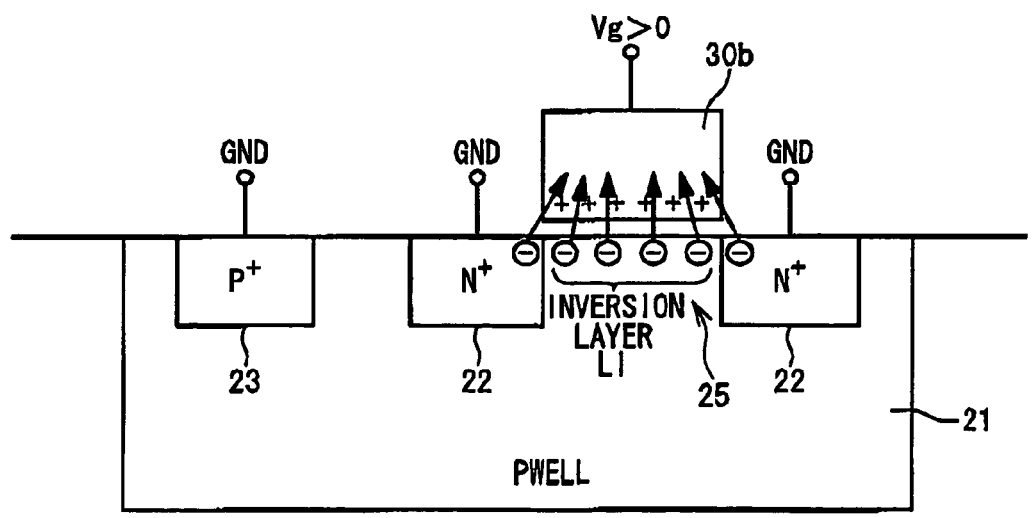
FIG. 6 is a schematic diagram showing electron injection during the data erasing operation.

FIG. 6 shows in detail the condition of the second MOS transistor 20 in which the FN tunneling occurs. A large number of electrons concentrate in a surface portion of the P-well 21 within the tunneling region 25 to form an "inversion layer LI" like an N-type semiconductor. The inversion layer LI is connected to the adjacent N+ diffusion layers 22 and thus the potential of the inversion layer LI is fixed to the ground potential GND. Therefore, distribution of the electric field between the gate electrode 30b and the N+ diffusion layers 22/the inversion layer LI becomes symmetrical and uniform (even). In other words, the electric field is applied to the gate insulating film symmetrically and uniformly (evenly). As a result, electrons are injected into the gate electrode 30b evenly through the entire gate insulating film in the tunneling region 25. Since a local electron injection through a part of the gate insulating film is prevented, the deterioration of the gate insulating film is suppressed. In comparison with the conventional electron injection based on the CHE method, the electron injection according to the present embodiment brings about a conspicuous effect.

2-2. PROGRAM (Hole Injection)

Figure 7:
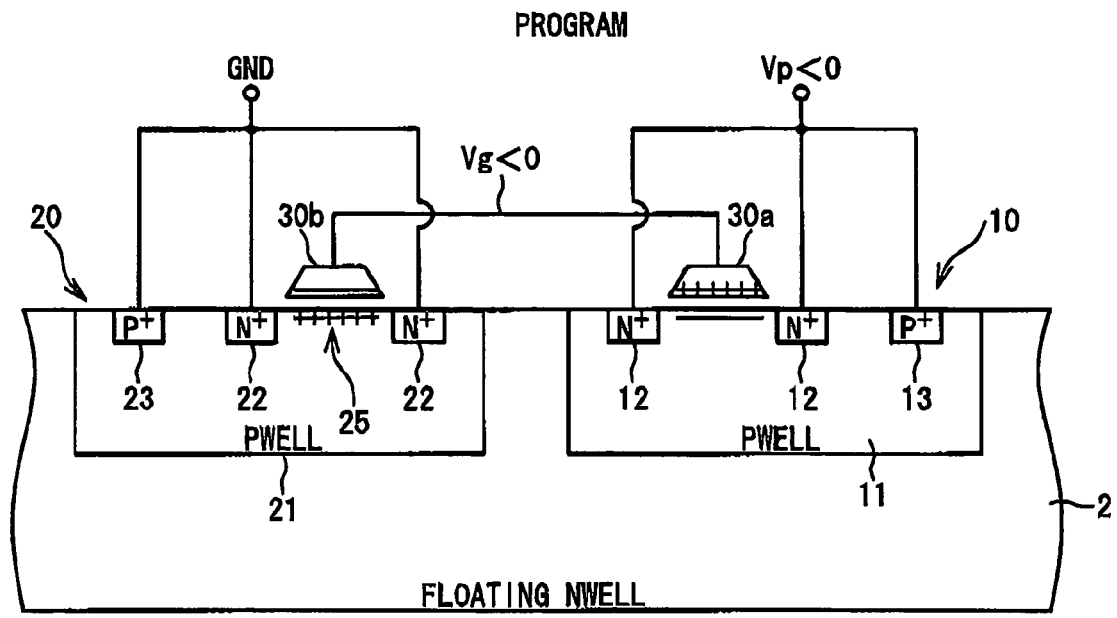
FIG. 7 is a schematic diagram showing a data programming operation (PROGRAM) according to the present embodiment.

In the programming operation, holes are injected into (electrons are ejected from) the floating gate 30. An example of a condition of the nonvolatile memory cell at the time of the programming operation is shown in FIG. 7 in a similar manner as in FIG. 5. The potentials applied to the P-well 11, the P-well 21, the N+ diffusion layers 12 and the N+ diffusion layers 22 can be designed appropriately. For example, as shown in FIG. 7, a negative programming potential Vp is applied to the P-well 11 and the N+ diffusion layers (source/drain) 12 of the first MOS transistor 10. On the other hand, the ground potential GND is applied to the P-well 21 and the N+ diffusion layers (source/drain) 22 of the second MOS transistor 20. As a result, the potential Vg as given by the above equation (1) is induced at the floating gate 30. In this case, the first MOS transistor 10 is in the inversion mode, while the second MOS transistor 20 is in the accumulation mode.

Figure 1:
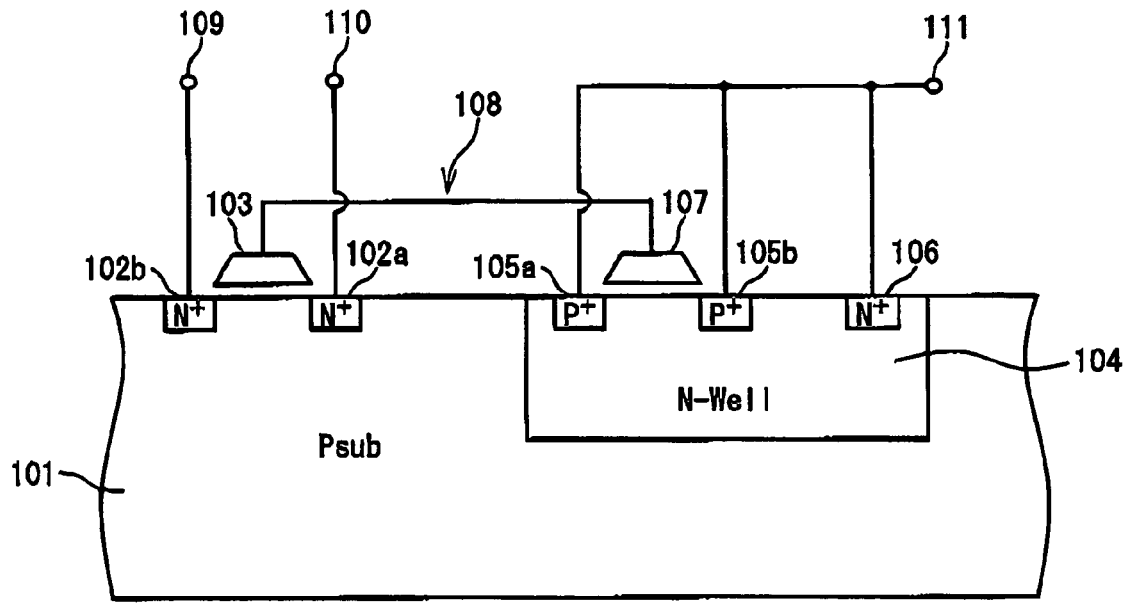
FIG. 1 is a cross-sectional view schematically showing a structure of a conventional single poly EEPROM.
Figure 2:
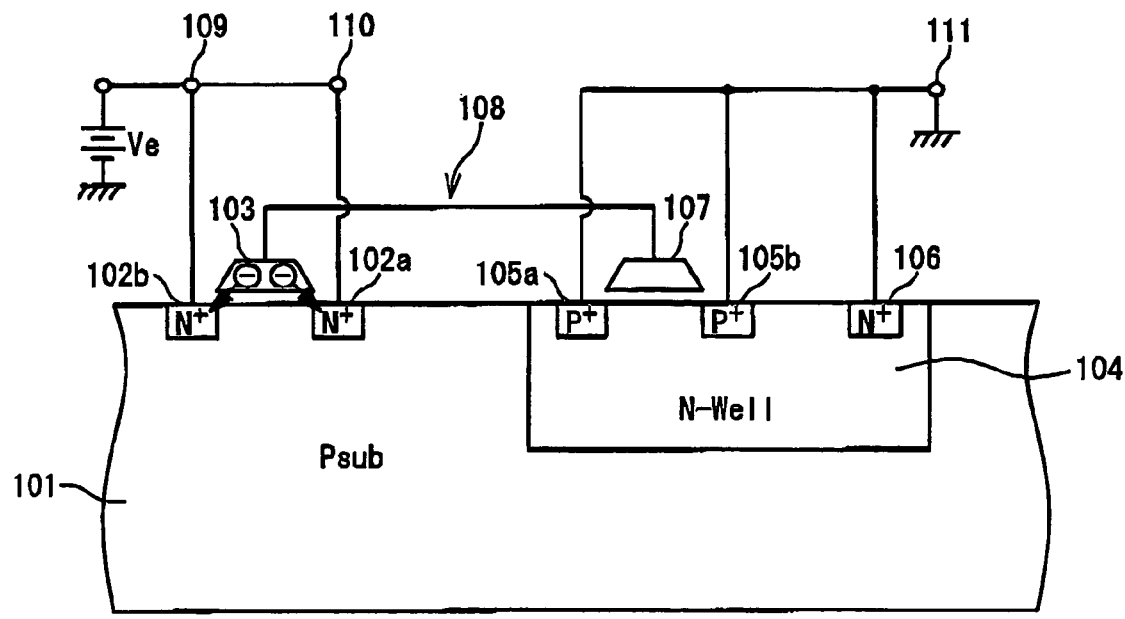
FIG. 2 is a view showing a data programming operation with respect to the single poly EEPROM shown in FIG. 1.

It should be noted here that the potential applied to the N+ diffusion layers 22 and the potential applied to the P-well 21 are the same potential GND, which is different from the conventional technique shown in FIG. 2. According to the conventional technique shown in FIG. 2, the high potential Ve can not be applied to the P-type substrate 101 because the PMOS transistor and the NMOS transistor are provided and the P-type substrate 101 contacts the N-well 104. The potential of the P-type substrate 101 is greatly different from that of the source/drain 102, and thus the charge transfer occurs locally between the gate electrode 103 and the source/drain 102. According to the present embodiment, on the other hand, the NMOS transistors 10, 20 of the same conductivity type are provided and thus there is no constraint on the bias between the P-well 11 and the P-well 21. It is therefore possible to apply the same potential (GND) to the source/drain 22 and the P-well 21.

Figure 8:
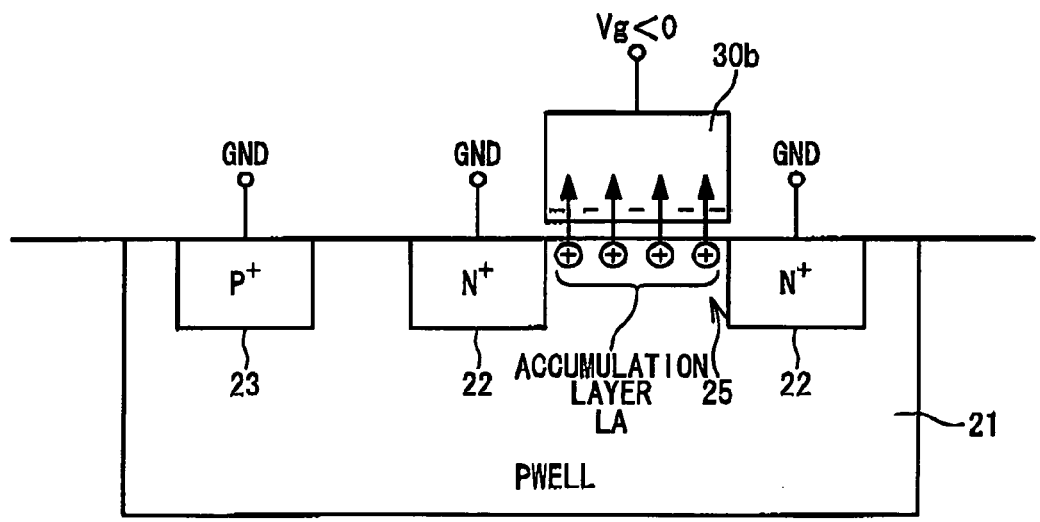
FIG. 8 is a schematic diagram showing hole injection during the data programming operation.

FIG. 8 shows in detail the condition of the second MOS transistor 20 in which the FN tunneling occurs. A large number of holes concentrate in the surface portion of the P-well 21 within the tunneling region 25 to form an "accumulation layer LA". As described above, the potentials applied to the N+ diffusion layers 22 and the P-well 21 are the same potential GND. Therefore, distribution of the electric field between the gate electrode 30b and the N+ diffusion layers 22/the P-well 21 becomes symmetrical and uniform (even). In other words, the electric field is applied to the gate insulating film substantially uniformly (evenly). As a result, holes are injected from the P-well 21 into the gate electrode 30b evenly through the entire gate insulating film in the tunneling region 25. Since a local hole injection through a part of the gate insulating film is prevented, the deterioration of the gate insulating film is suppressed. In comparison with the conventional technique shown in FIG. 2, the hole injection according to the present embodiment brings about a conspicuous effect.

2-3. Read

Figure 9:
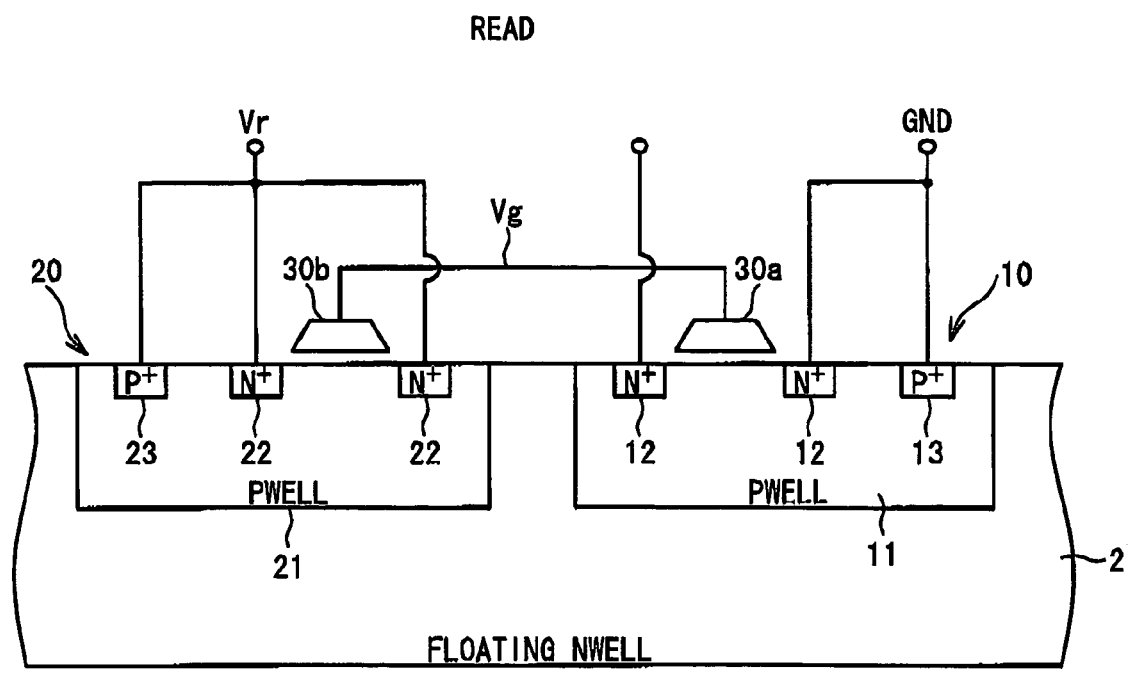
FIG. 9 is a schematic diagram showing a data read operation (READ) according to the present embodiment.

FIG. 9 shows an example of a condition of the nonvolatile memory cell at the time of the reading operation. For example, a read potential Vr is applied to the source/drain 22 and the P-well 21 of the second MOS transistor 20. Furthermore, the ground potential GND is applied to the source 12 and the P-well 11 of the first MOS transistor 10, and a predetermined potential is applied to the drain 12 thereof. By detecting whether the first MOS transistor 10 is turned ON or not, it is possible to sense a threshold voltage of the first MOS transistor 10, namely, the potential state of the floating gate 30 corresponding to the stored data.

3. Effects

As described above, the nonvolatile memory cell according to the present embodiment is constituted by the two MOS transistors 10, 20 of the same conductive type. As a result, the electric field is applied to the gate insulating film of the second MOS transistor 20 substantially uniformly, as shown in FIGS. 6 and 8. Since a local charge transfer through a part of the gate insulating film is prevented, the deterioration of the gate insulating film is suppressed. In particular, at the time of the programming operation, the charge transfer only between the gate electrode and the source/drain is prevented, because there is no potential difference between the P-well 21 and the source/drain 22 as shown in FIG. 8. Since the local charge transfer through a part of the gate insulating film is prevented in this manner, lifetime of the gate insulating film is increased. Therefore, data-hold characteristic and reliability of the nonvolatile memory cell are improved.

Moreover, according to the present embodiment, the first MOS transistor 10 of the two MOS transistors is used as the read transistor, while the second MOS transistor 20 is used for the FN tunneling. In this case, unnecessary stress (such as hot carriers at the time of the data reading operation) is not applied to the tunneling region 25 of the second MOS transistor 20 during other than the programming/erasing operations. Since the stress is dispersed, deterioration of the gate insulating film and the like is suppressed and hence the reliability of the nonvolatile memory cell is improved.

Furthermore, the nonvolatile memory cell according to the present embodiment is constituted by two elements (the first MOS transistor 10 and the second MOS transistor 20). Therefore, the memory cell area is reduced as compared with the case of three elements (the tunneling capacitor, the coupling capacitor and the read transistor) as in the conventional technique.

It is apparent that the present invention is not limited to the above embodiment and may be modified and changed without departing from the scope and spirit of the invention. For example, described in the foregoing embodiment is the case where two N-channel MOS transistors are provided. However, the present invention is not limited to the case. The nonvolatile memory cell according to the present invention may be constituted by two P-channel MOS transistors. In this case, respective of the two P-channel MOS transistors are formed on N-wells.

What is claimed is:

1. An EEPROM having a nonvolatile memory cell, said nonvolatile memory cell comprising:
   a first MOS transistor;
   a second MOS transistor;
   a floating well formed of a first conductivity type;
   wherein said first MOS transistor and said second MOS transistor comprise a floating gate electrode in common, and said first MOS transistor and said second MOS transistor are of a same conductivity type;
   wherein the first MOS transistor and the second MOS transistor are associated with a second well; and
   wherein in data reading, a reading potential is applied to said second MOS transistor, a first potential is applied to a source and P-well of the first MOS transistor, and a second potential is applied to a drain of the first MOS transistor is an accumulation mode and the second MOS transistor is in an inversion mode.

2. The EEPROM according to claim 1,
   wherein said first MOS transistor is formed on a first well, the first well formed on the floating well, in a substrate, and said second MOS transistor is formed on a second well, the second well formed on the floating well, in said substrate,
   wherein both of said first MOS transistor and said second MOS transistor comprise the first conductivity type, while both of said first well and said second well comprise a second conductivity type opposite to said first conductivity type.

3. The EEPROM according to claim 1, wherein the first conductivity type comprises an N-type, and
   wherein the second conductivity type comprises a P-type.

4. The EEPROM according to claim 1, wherein in data erasing, a first potential is applied to the floating gate, an erasing potential is applied to said first MOS transistor, a third potential is applied to the second MOS transistor.

5. The EEPROM according to claim 4, wherein in the data erasing, the first MOS transistor is an accumulation mode and the second MOS transistor is in an inversion mode.

6. The EEPROM according to claim 1, wherein in data programming, a first potential is applied to the floating gate, a programming potential is applied to said first MOS transistor, a third potential is applied to the second MOS transistor.

7. The EEPROM according to claim 6, wherein in the data programming, the first MOS transistor is an inversion mode and the second MOS transistor is in an accumulation mode.

8. The EEPROM according to claim 1, wherein a status of the first MOS transistor is detected to determine whether the first MOS transistor is on or off.

9. The EEPROM according to claim 1, wherein a potential state of the floating gate corresponds to stored data.

10. The EEPROM according to claim 1, wherein the first MOS transistor comprises a read transistor.

11. The EEPROM according to claim 1, wherein the second MOS transistor comprises a Fowler-Nordheim (FN) tunneling transistor.

12. An EEPROM having a nonvolatile memory cell, said nonvolatile memory cell comprising:

a first MOS transistor;

a second MOS transistor; and a floating well formed of a first conductivity type, wherein said first MOS transistor and said second MOS transistor comprise a floating gate electrode in common, and said first MOS transistor and said second MOS transistor are of a same conductivity type, and wherein said first MOS transistor is formed on a first well, the first well formed on the floating well, in a substrate, and said second MOS transistor is formed on a second well, the second well formed on the floating well, in said substrate, wherein both of said first MOS transistor and said second MOS transistor comprise the first conductivity type, while both of said first well and said second well comprise a second conductivity type opposite to said first conductivity type, wherein in data programming and erasing, a first potential is applied to said first well, a source and a drain of said first MOS transistor, and a second potential different from said first potential by a predetermined potential difference is applied to said second well, a source and a drain of said second MOS transistor, such that charge injection and ejection with respect to said floating gate electrode occur through a gate insulating film of said second MOS transistor.

13. The EEPROM according to claim 12, wherein a MOS capacitance of said second MOS transistor is smaller than that of said first MOS transistor.

14. The EEPROM according to claim 12, wherein in data reading, a potential state of said floating gate electrode is detected by using said first MOS transistor.

15. The EEPROM according to claim 13, wherein in data reading, a potential state of said floating gate electrode is detected by using said first MOS transistor.

16. The EEPROM according to claim 12, wherein said floating gate electrode is formed of a single-layer polysilicon.

17. An EEPROM having a nonvolatile memory cell, said nonvolatile memory cell comprising:

a semiconductor substrate of a first conductivity;

a floating well of a second conductivity formed on said substrate;

a first well of said first conductivity;

a first diffusion layer of said first conductivity formed on said first well, said first diffusion layer extending along a first line;

a second diffusion layer of said second conductivity formed on said first well, said second diffusion layer extending along a second line in parallel with said first line;

a third diffusion layer of said second conductivity formed on said first well, said third diffusion layer extending along a third line in parallel with said first line, none of said first to third line overlapping with one another;

a floating gate formed on said first well between said second and third diffusion layers to constitute a MOS transistor having said second diffusion layer as a source and said third diffusion layer as a drain, said floating gate extending along a forth line in parallel with said first line;

a second well of said first conductivity which is smaller than said first well;

a fourth diffusion layer of said first conductivity formed on said second well, said fourth diffusion layer being arranged on said first line;

a fifth diffusion layer of said second conductivity formed on said second well, said fifth diffusion layer being arranged on said second line and smaller than said second diffusion layer; and a sixth diffusion layer of said second conductivity formed on said second well, said sixth diffusion layer being arranged on said third line and smaller than said third diffusion layer, wherein said floating gate extends on said second well between said fifth and sixth diffusion layers to constitute a MOS transistor having said fifth diffusion layer as one of source and drain and said third diffusion layer as the other of source and drain.

* * * * *